United States Patent
Lai et al.

(10) Patent No.: US 7,709,823 B2
(45) Date of Patent: May 4, 2010

(54) GROUP-III NITRIDE VERTICAL-RODS SUBSTRATE

(75) Inventors: Chih-Ming Lai, Pingtung County (TW); Wen-Yueh Liu, Taipei (TW); Jenq-Dar Tsay, Kaohsiung (TW); Jung-Tsung Hsu, Hsinchu (TW); Shang-Jr Gwo, Hsinchu (TW); Chang-Hong Shen, Yilan County (TW); Hon-Way Lin, Taipei (TW)

(73) Assignees: Industrial Technology Research Institute, Hsinchu (TW); National Tsing Hua University, Hsinchu (TW)

(*) Notice: Subject to any disclaimer, the term of this patent is extended or adjusted under 35 U.S.C. 154(b) by 293 days.

(21) Appl. No.: 11/552,527

(22) Filed: Oct. 25, 2006

(65) Prior Publication Data

US 2007/0272914 A1   Nov. 29, 2007

(30) Foreign Application Priority Data

May 25, 2006   (TW) ............... 95118646 A

(51) Int. Cl.
  *H01L 29/12* (2006.01)
(52) U.S. Cl. .............. 257/9; 257/101; 257/13; 257/E21.123; 257/E21.127; 257/E21.131; 257/E21.126; 257/E33.005; 438/462; 438/483; 438/409; 438/94

(58) Field of Classification Search ............... None
  See application file for complete search history.

(56) References Cited

U.S. PATENT DOCUMENTS

| | | | |
|---|---|---|---|
| 2002/0192441 A1 | 12/2002 | Kalkan et al. | |
| 2004/0157358 A1* | 8/2004 | Hiramatsu et al. | 438/93 |
| 2005/0082543 A1* | 4/2005 | Alizadeh et al. | 257/79 |
| 2005/0179052 A1 | 8/2005 | Yi et al. | |
| 2005/0194598 A1* | 9/2005 | Kim et al. | 257/79 |
| 2005/0208302 A1 | 9/2005 | Yi et al. | |
| 2005/0235904 A1 | 10/2005 | Lee et al. | |
| 2006/0091408 A1* | 5/2006 | Kim et al. | 257/94 |

FOREIGN PATENT DOCUMENTS

| | | |
|---|---|---|
| CN | 1659713 | 8/2005 |
| JP | 11-265853 | 9/1999 |
| JP | 2003-031501 | 1/2003 |

\* cited by examiner

*Primary Examiner*—N Drew Richards
*Assistant Examiner*—Swapneel Chhaya
(74) *Attorney, Agent, or Firm*—Jianq Chyun IP Office

(57) ABSTRACT

The invention is directed to a group-III nitride vertical-rods substrate. The group-III vertical-rods substrate comprises a substrate, a buffer layer and a vertical rod layer. The buffer layer is located over the substrate. The vertical rod layer is located on the buffer layer and the vertical rod layer is comprised of a plurality of vertical rods standing on the buffer layer.

21 Claims, 3 Drawing Sheets

GROUP-III NITRIDE VERTICAL-RODS SUBSTRATE

CROSS-REFERENCE TO RELATED APPLICATION

This application claims the priority benefit of Taiwan application serial no. 95118646, filed on May 25, 2006. All disclosure of the Taiwan application is incorporated herein by reference.

BACKGROUND OF THE INVENTION

1. Field of Invention

The present invention relates to a group III-V semiconductor substrate. More particularly, the present invention relates to a group III nitride vertical-rods substrate.

2. Description of Related Art

Currently, light emitted diodes and laser diodes are widely applied. For example, the combination of the blue emitting device made of gallium nitride and the yellow fluorescent powder can produce white light. The light emitted diodes and laser diodes not only can provide lights with higher brightness than those provided by the traditional light bulbs but also consume less power than that consumed by the traditional light bulbs. Moreover, the life time of the light emitted diode is about ten-thousand hours which is longer than that of the traditional light bulb.

The light emitted diodes producing colorful light including red, green, blue and ultraviolet, in the market, are mainly made of gallium nitride compound series. Since the lattice constant, the thermal expansion coefficient and the chemical properties of the sapphire are different from those of the gallium nitride, the gallium nitride growing on the heterogeneous substrate, such as silicon substrate, silicon carbide substrate and sapphire, possesses many defects and dislocations. Those dislocations will cause the increasing of the loss of emitted light by gallium nitride based light emitting devices. This kind of dislocation affects the performances and the life times of the light emitted diode and the gallium-nitride-series laser diode.

In order to decrease the numbers of the threading dislocations, several substrate structures are developed in conventional technology. FIG. 1 is a cross-sectional view showing a conventional group-III nitride substrate. As shown in FIG. 1, a substrate 100 has a gallium nitride buffer layer formed thereon and there are several barrier patterns 104 disposed on the gallium nitride buffer layer 102. A semiconductor layer 106, which is the gallium nitride epitaxial layer, grows from the exposed gallium nitride buffer layer 102 between the barrier patterns 104 and covers the barrier patterns 104. This kind of substrate structure utilizes barrier patterns to block partial of the dislocations so that the portion of the gallium nitride epitaxial layer grown over the barrier patterns 104 does not possess threading dislocations. However, the gallium nitride still has serious local dislocation phenomenon. On the other words, the portion of the gallium nitride not over the barrier patterns has relatively higher distribution of the dislocations.

FIG. 2 is a cross-sectional view showing a conventional group-III nitride substrate. As shown in FIG. 2, a substrate 200 has a buffer layer 202 and a crystal seed layer 204 formed thereon. Then, several trenches 206 are formed to penetrate the buffer layer 202 and the crystal seed layer 204. That is, the buffer layer 202 and the crystal seed layer 204 are patterned to be the strip-like structures. By using the selectively lateral growth of the heterogeneous substrate, which is so-called pendeo-epitaxy (PE), the gallium nitride only suspensorily-and-laterally grows at the sidewall of the strip-like crystal seed layer 204 and then covers the strip-like crystal seed layer 204 for keeping the gallium nitride epitaxial layer from growing vertical penetrating dislocations. Similar to the gallium nitride epitaxial layer growing on the substrate structure shown in FIG. 1, the aforementioned suspensory growth of the gallium nitride epitaxial layer possesses local threading dislocation problem. On the other words, the possibility for forming the threading dislocation phenomenon highly is concentrated at some local area. Therefore, the gallium nitride epitaxial layer growing on this kind of substrate structure is not the total dislocation free.

Because both of the group-III nitride epitaxial layers growing on the aforementioned substrate substrates have threading dislocation problems, the thickness of the group-III nitride epitaxial layer is limited to the dislocation phenomenon and is less than 20 micron meters.

SUMMARY OF THE INVENTION

Accordingly, at least one objective of the present invention is to provide a group-III nitride vertical-rods substrate capable of providing a semiconductor layer growing environment with a uniform dislocation distribution.

At least another objective of the present invention is to provide a group-III nitride vertical-rods substrate capable of providing a structure attenuate point which contributes to the separation between the semiconductor layer and the substrate.

To achieve these and other advantages and in accordance with the purpose of the invention, as embodied and broadly described herein, the invention provides a group-III nitride vertical-rods substrate. The group-III vertical-rods substrate comprises a substrate, a buffer layer and a vertical rod layer. The buffer layer is located over the substrate. The vertical rod layer is located on the buffer layer and the vertical rod layer is comprised of a plurality of vertical rods standing on the buffer layer.

According to one embodiment of the present invention, the material of each of the vertical rod includes group-III nitride.

According to one embodiment of the present invention, the material of each of the vertical rod includes gallium nitride.

According to one embodiment of the present invention, the buffer layer is a complex layer. The complex layer includes a silicon nitride/group-III nitride layer. The thickness of the buffer layer is about 1~60 nano meters.

According to one embodiment of the present invention, the material of the buffer layer includes silicon nitride. The thickness of the buffer layer is less than 10 nano meters.

According to one embodiment of the present invention, a diameter of a cross-section of each of the vertical rods is about 60~150 nano meters.

According to one embodiment of the present invention, the group-III nitride vertical-rods substrate further comprises a group-III nitride layer located on the vertical rod layer.

According to one embodiment of the present invention, the thickness of the vertical rod layer is about 10 nano meters~5 micron meters.

According to one embodiment of the present invention, the distribution density of the vertical rods of the vertical rod layer over the substrate is about $10^9/cm^2$~$10^{12}/cm^2$.

The present invention further provides a group-III nitride vertical-rods substrate. The group-III nitride vertical-rods substrate comprises a substrate, a vertical rod layer and a group III nitride semiconductor layer. The vertical rod layer is disposed on the substrate and the vertical rod layer is comprised of a plurality of monomorphism vertical rods. The gallium nitride semiconductor layer is disposed on the vertical rod layer.

According to one embodiment of the present invention, the group-III nitride vertical-rods substrate further comprises a silicon nitride buffer layer located between the substrate and the vertical rod layer. The thickness of the silicon nitride layer is less than 10 nano meters. A sub-buffer layer is located between the silicon nitride buffer layer and the vertical rod layer. The thickness of the sub-buffer layer is about 1~50 nano meters. The material of the sub-buffer layer includes group-III nitride.

According to one embodiment of the present invention, the material of each of the vertical rod includes group-III nitride.

According to one embodiment of the present invention, the material of each of the vertical rods includes gallium nitride.

According to one embodiment of the present invention, the thickness of the vertical rod layer is about 10 nano meters~5 micron meters.

According to one embodiment of the present invention, the distribution density of the vertical rods of the vertical rod layer over the substrate is about $10^9/cm^2 \sim 10^{12}/cm^2$.

According to one embodiment of the present invention, a diameter of a cross-section of each of the vertical rods is about 60~150 nano meters.

In the present invention, by using the grain arrangement provided by the surface of the buffer layer, the vertical rods perpendicular to the surface of the substrate can grow on the buffer layer. Meanwhile, each of the vertical rods possesses relatively high monomorphism property and has no dislocation phenomenon. Furthermore, when the semiconductor layer is formed on the vertical rod layer, since the surface of the vertical rod layer provides a dislocation free epitaxial environment, the semiconductor layer epitaxially growing on the vertical rod layer has relatively low dislocation density and the thickness of the semiconductor layer is relatively large. Moreover, by using the vertical rod layer as an attenuate point of the structure, the semiconductor layer can be easily separated from the substrate through the vertical rod layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
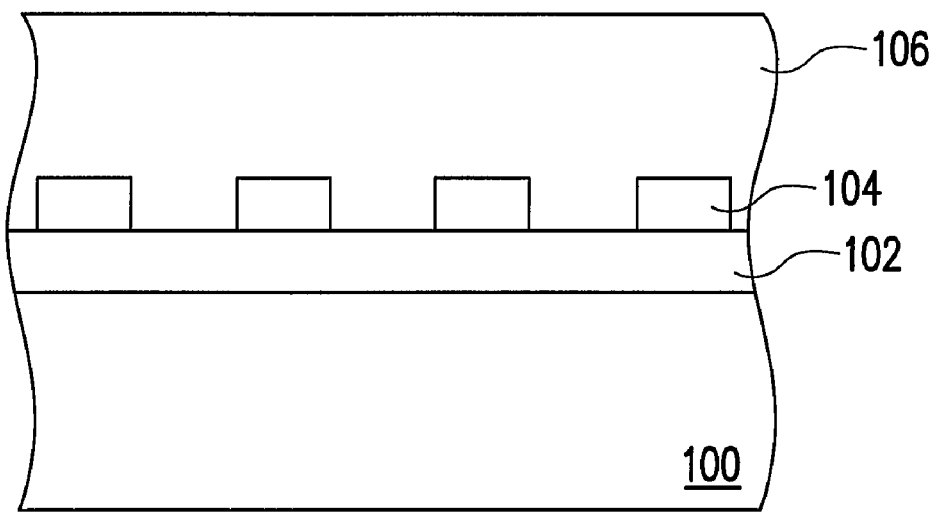
FIG. 1 is a cross-sectional view showing a conventional group-III nitride substrate.
Figure 2:
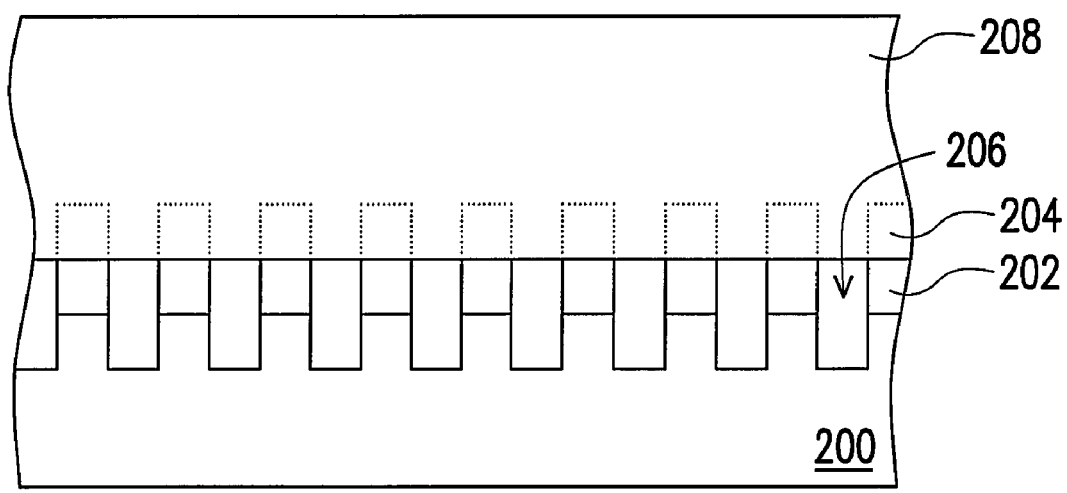
FIG. 2 is a cross-sectional view showing a conventional group-III nitride substrate.
Figure 3A:
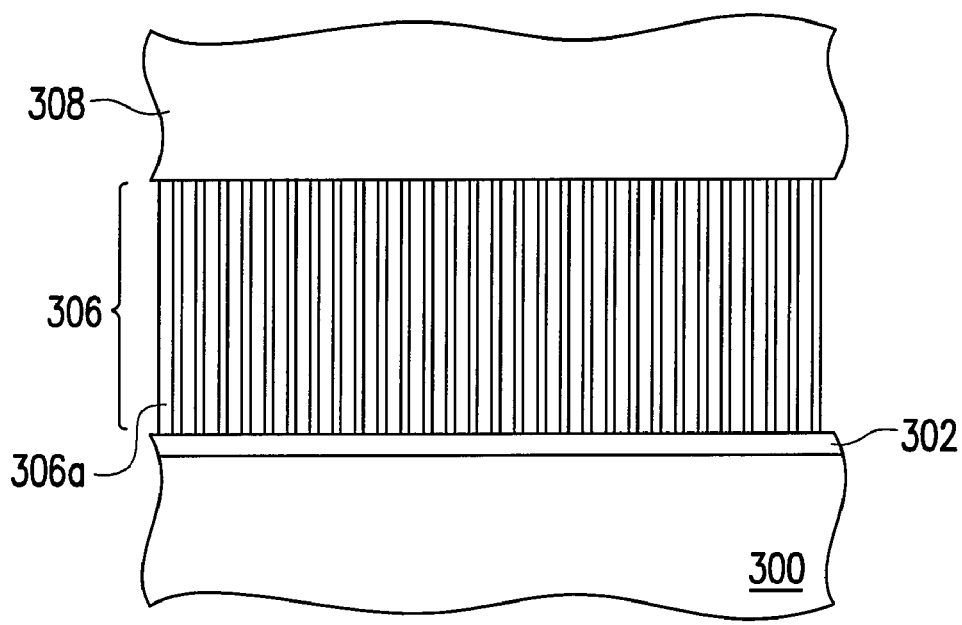
FIG. 3A is a cross-sectional view showing a group-III nitride vertical-rods substrate according to one embodiment of the present invention.

FIG. 3A is a cross-sectional view showing a group-III nitride vertical-rods substrate according to one embodiment of the present invention.

As shown in FIG. 3A, a group-III nitride vertical-rods substrate of the present invention comprises a substrate 300, a buffer layer 302, a vertical rod layer 306 and a semiconductor layer 308. The substrate 300 can be, for example, made of silicon, silicon carbide or sapphire. The buffer layer 302 is disposed on the substrate 300 and the buffer layer 302 can be, for example, made of nitride such as silicon nitride or group-III silicon nitride compound which includes indium silicon nitride. The thickness of the buffer layer 302 can be, for example, less than 10 nano-meters.

Figure 3B:
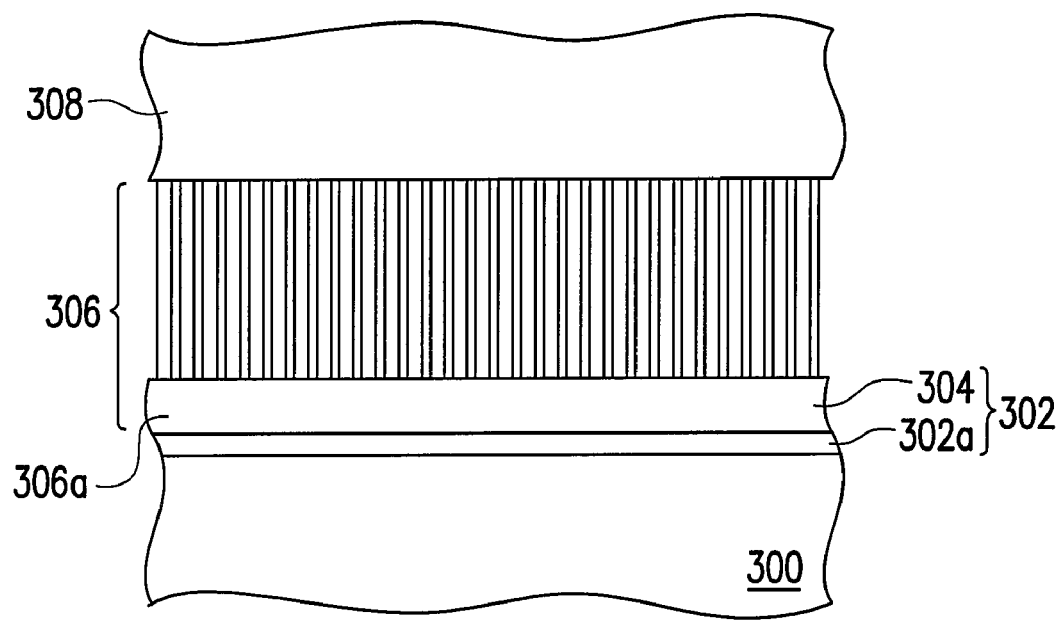
FIG. 3B is a cross-sectional view showing another group-III nitride vertical-rods substrate according to one embodiment of the present invention.

Moreover, the buffer layer can also be a complex structure. That is, the buffer layer 302 can be a complex structure (shown in FIG. 3B) comprised of a main buffer layer 302a and a sub-buffer layer 304 disposed over the main buffer layer 302a. As shown in FIG. 3B, the main buffer layer 302a can be, for example, made of nitride such as silicon nitride or group-III silicon nitride including indium silicon nitride. The sub-buffer layer 304 can be made of group-III nitride. The group-III element comprises aluminum, gallium, indium and thallium. Preferably, the aforementioned buffer layer 304 can be made of indium nitride. The main buffer layer 302a and the sub-buffer layer 304 can compose of a buffer layer having a complex structure. That is, as shown in FIG. 3B, when the group-III nitride vertical-rods substrate has a complex-structure buffer layer 302, the buffer layer 302 has the complex structure can be, for example, a silicon nitride/group-III nitride complex layer. Moreover, in FIG. 3B, the thickness of the main buffer layer 302a is about 10 nano meters and the thickness of the sub-buffer layer is about 1~50 nano meters. On the other words, as shown in FIG. 3B, when the buffer layer is a complex layer having the main buffer layer 302a and the sub-buffer layer 304, the thickness of the buffer layer 302, the complex-structure buffer layer, is about 1~60 nano meters.

Furthermore, the aforementioned vertical rod layer 306 is located over the aforementioned buffer layer and the vertical rod layer 306 is composed of several vertical rods 306a disposed over the substrate 300. Each of the vertical rods 306a can be, for example, made of group-III nitride. Preferably, for example, the vertical rods are made of gallium nitride. Further, the thickness of the vertical rod layer 306 is about 10 nano meters ~5 micron meters. It should be noticed that the distribution density of the vertical rods 306a of the vertical rod layer 306 over the substrate 300 is about 109/cm2~1012/cm2.

Figure 4:
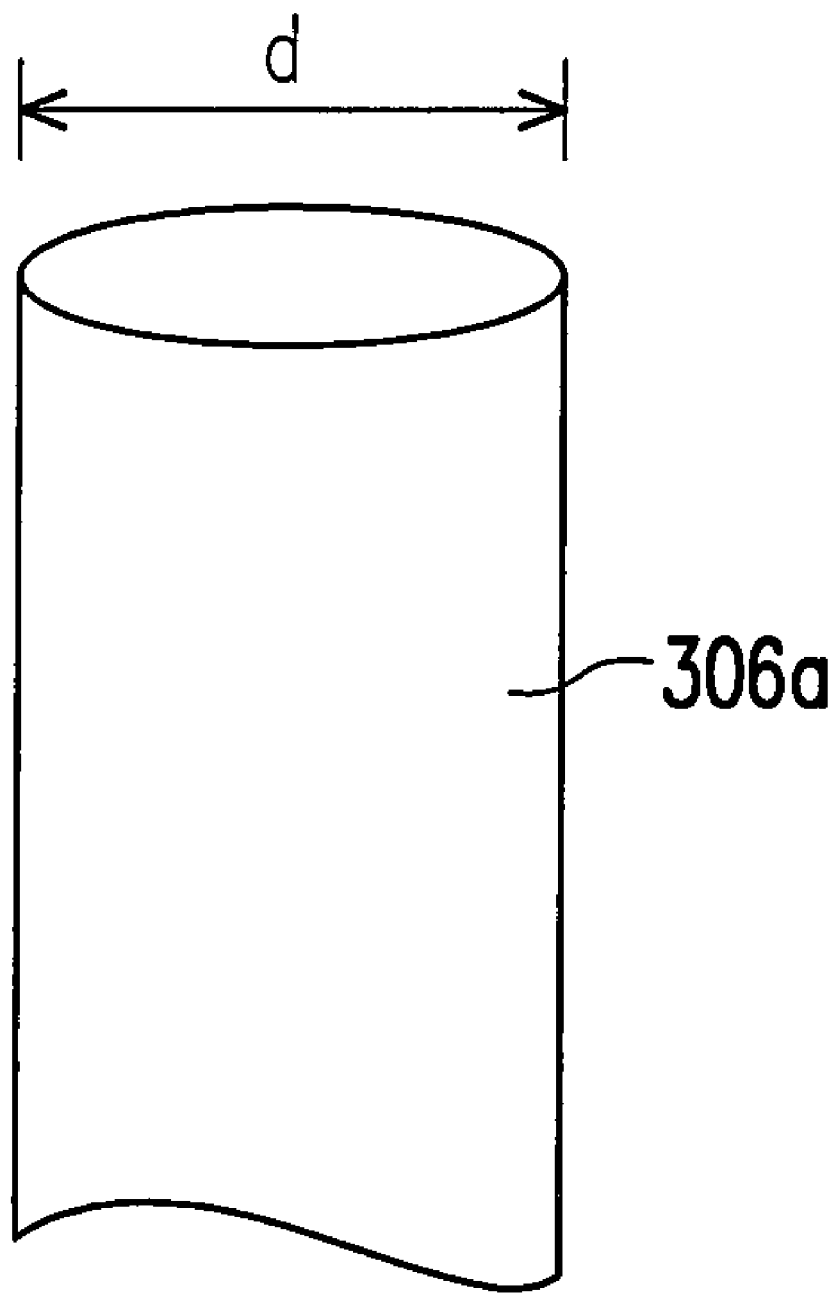
FIG. 4 is a cross-sectional view showing a vertical rod of a group-III nitride vertical-rods substrate according to one embodiment of the present invention.

FIG. 4 is a cross-sectional view showing a vertical rod of a group-III nitride vertical-rods substrate according to one embodiment of the present invention. As shown in FIG. 4, the diameter d of the cross-section of a single vertical rod 306a is about 60~150 nano meters. It should be noticed that each vertical rod 306a possesses relatively high monomorphism property and is free from the dislocation phenomenon.

In addition, the group-III nitride vertical-rods substrate of the present invention further comprises a semiconductor layer 308. The thickness of the semiconductor layer 308 is larger than 20 micron meters. The semiconductor layer 308 can be, for example, made of group-III nitride. Preferably, the semiconductor layer 308 is made of gallium nitride. This semiconductor layer 308 is an epitaxial layer serving as a substrate for later formed group-III nitride device.

By using the grain arrangement provided by the surface of the buffer layer or the complex-structure buffer layer, the vertical rods perpendicular to the surface of the substrate are formed on the buffer layer, wherein each of the vertical rods has relatively high monomorphism property and is free from the dislocation phenomenon. While the semiconductor layer is formed over the vertical-rod layer, the dislocations in the semiconductor layer epitaxially formed on the vertical rod layer is uniform distributed since the surface of the vertical rod layer provides a dislocation free epitaxial environment.

Furthermore, since the vertical rod layer is located between the substrate and the semiconductor layer in the group-III nitride vertical-rods substrate of the present invention, the vertical rod layer can be served as a stress releasing point between heterogeneous lattices. Therefore, the thickness of the semiconductor layer formed over the vertical rod layer is relatively large. Additionally, by using the vertical rod layer as a structure attenuate point, it is easy to separate the semiconductor layer from the substrate through the vertical rod layer.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A group-III nitride vertical-rods substrate, comprising:
a substrate; a buffer layer located over the substrate;
a vertical rod layer located on the buffer layer, wherein the vertical rod layer is comprised of a plurality of vertical rods standing on the buffer layer; and each of the vertical rods is directly in contact with the buffer layer and the plurality of vertical rods and the buffer layer are made of different materials and a portion of a surface of the buffer layer is exposed between the vertical rods
a group-III nitride semiconductor layer extending substantially across an entire area above the vertical rod layer.

2. The group-III nitride vertical-rods substrate of claim 1, wherein the material of each of the vertical rod includes group-III nitride.

3. The group-III nitride vertical-rods substrate of claim 1, wherein the material of each of the vertical rod includes gallium nitride.

4. The group-III nitride vertical-rods substrate of claim 1, wherein the buffer layer is a multi-layered layer.

5. The group-III nitride vertical-rods substrate of claim 4, wherein the multi-layered layer comprises a group-III nitride layer and a silicon nitride layer stacked on the group-III nitride layer.

6. The group-III nitride vertical-rods substrate of claim 4, wherein the thickness of the buffer layer is about 1-60 nano meters.

7. The group-III nitride vertical-rods substrate of claim 1, wherein the material of the buffer layer includes silicon nitride.

8. The group-III nitride vertical-rods substrate of claim 7, wherein the thickness of the buffer layer is less than 10 nano meters.

9. The group-III nitride vertical-rods substrate of claim 1, wherein a diameter of a cross-section of each of the vertical rods is about 60-150 nano meters.

10. The group-III nitride vertical-rods substrate of claim 1, wherein the thickness of the vertical rod layer is about 10 nano meters 5 micrometers.

11. The group-III nitride vertical-rods substrate of claim 1, wherein the distribution density of the vertical rods of the vertical rod layer over the substrate is about $10^9/cm^2$-$10^{12}/cm^2$.

12. The group-III nitride vertical-rods substrate of claim 1, wherein the thickness of the group-III nitride semiconductor layer is larger than 20 micrometers.

13. A group-III nitride vertical-rods substrate, comprising:
a substrate; a vertical rod layer located over the substrate, wherein the vertical rod layer is comprised of a plurality of vertical rods standing on a buffer layer over the substrate; and
a group-III nitride semiconductor layer extending substantially across an entire area above the vertical rod layer, wherein the thickness of the group-III nitride semiconductor layer is larger than 20 micrometers.

14. The group-III nitride vertical-rods substrate of claim 13, wherein the material of each of the vertical rod includes group-III nitride.

15. The group-III nitride vertical-rods substrate of claim 13, wherein the material of each of the vertical rod includes gallium nitride.

16. The group-III nitride vertical-rods substrate of claim 13, wherein the buffer layer is a multi-layered layer.

17. The group-III nitride vertical-rods substrate of claim 16, wherein the multi-layered layer comprises a group-III nitride layer and a silicon nitride layer stacked on the group-III nitride layer.

18. The group-III nitride vertical-rods substrate of claim 13, wherein the material of the buffer layer includes silicon nitride.

19. The group-III nitride vertical-rods substrate of claim 13, wherein a diameter of a cross-section of each of the vertical rods is about 60-150 nano meters.

20. The group-III nitride vertical-rods substrate of claim 13, wherein the thickness of the vertical rod layer is about 10 nano meters-5 micrometers.

21. The group-III nitride vertical-rods substrate of claim 13, wherein the distribution density of the vertical rods of the vertical rod layer over the substrate is about $10^9/cm^2$-$10^{12}/cm^2$.

* * * * *